(12) United States Patent
Plofsky et al.

(10) Patent No.: US 7,062,685 B1
(45) Date of Patent: Jun. 13, 2006

(54) TECHNIQUES FOR PROVIDING EARLY FAILURE WARNING OF A PROGRAMMABLE CIRCUIT

(75) Inventors: Jordan Plofsky, Sunnyvale, CA (US); Jayabrata Ghosh Dastidar, Santa Clara, CA (US); Michael Harms, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 545 days.

(21) Appl. No.: 10/317,436

(22) Filed: Dec. 11, 2002

(51) Int. Cl.
*G06F 11/00* (2006.01)

(52) U.S. Cl. .................................................. 714/47

(58) Field of Classification Search .............. 714/47, 714/30, 721, 724, 725
See application file for complete search history.

(56) References Cited

U.S. PATENT DOCUMENTS

| | | |
|---|---|---|
| 4,899,067 A | 2/1990 | So et al. |
| 5,369,314 A | 11/1994 | Patel et al. |
| 5,434,514 A | 7/1995 | Cliff et al. |
| 5,592,102 A | 1/1997 | Lane et al. |
| 5,790,479 A | 8/1998 | Conn |
| 5,991,898 A | 11/1999 | Rajski et al. |
| 6,034,536 A | 3/2000 | McClintock et al. |
| 6,098,032 A * | 8/2000 | Brookner .................... 702/182 |
| 6,107,820 A | 8/2000 | Jefferson et al. |
| 6,201,404 B1 | 3/2001 | Reddy et al. |
| 6,233,205 B1 | 5/2001 | Wells et al. |
| 6,249,885 B1 * | 6/2001 | Johnson et al. ................ 714/47 |
| 2002/0003742 A1 | 1/2002 | Nguyen et al. |
| 2003/0072185 A1 | 4/2003 | Lane et al. |

OTHER PUBLICATIONS

L. Zhao et al., "IDDQ Testing of Bridging Faults in Field Programmable Gate Arrays", Internal Report, 1996.*
Xilinx "Virtex-II Platform FPGAs: Detailed Description, Advance Product Specification," DS031-2 (v2.1.1) Dec. 6, 2002.
Xilinx "Virtex-II Platform FPGAs: Introduction and Overview, Advance Product Specification," DS031-1 (v1.9) Sep. 26, 2002; Xilinx "Virtex-II EasyPath FAQs" 4 pages total.

* cited by examiner

*Primary Examiner*—Robert Beausoliel
*Assistant Examiner*—Elmira Mehrmanesh
(74) *Attorney, Agent, or Firm*—Townsend and Townsend and Crew, LLP

(57) ABSTRACT

Techniques for monitoring the performance of a programmable circuit and to provide an early warning of a potential failure are provided. A processor monitors the performance of components on a programmable circuit over time. The processor stores performance characteristics for the components in memory. If the performance characteristics for particular components fall outside tolerance ranges, these components may to fail to operate according to specifications. Once the performance characteristics for particular components are outside the tolerance ranges, the processor sends out an alert signal. The alert signal indicates the possibility that the performance of the programmable circuit may violate the specifications in the future. The processor may repair the programmable circuit by re-routing around the problem components.

27 Claims, 1 Drawing Sheet

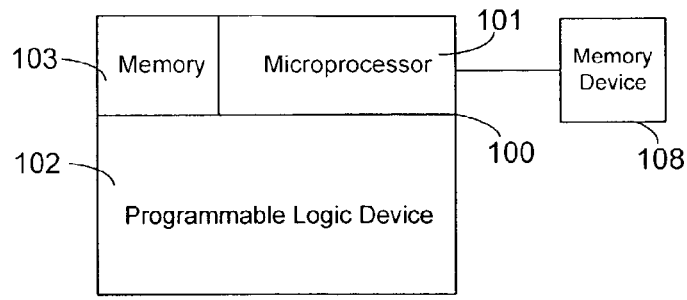
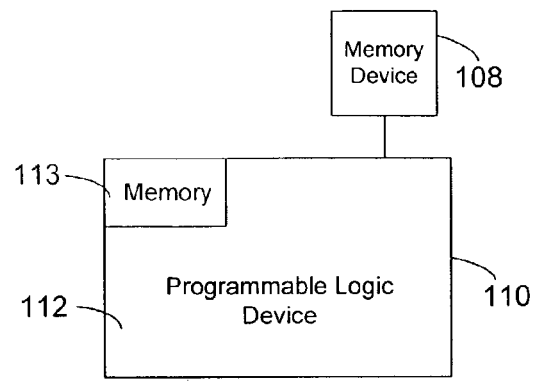
FIG. 1A
FIG. 1B
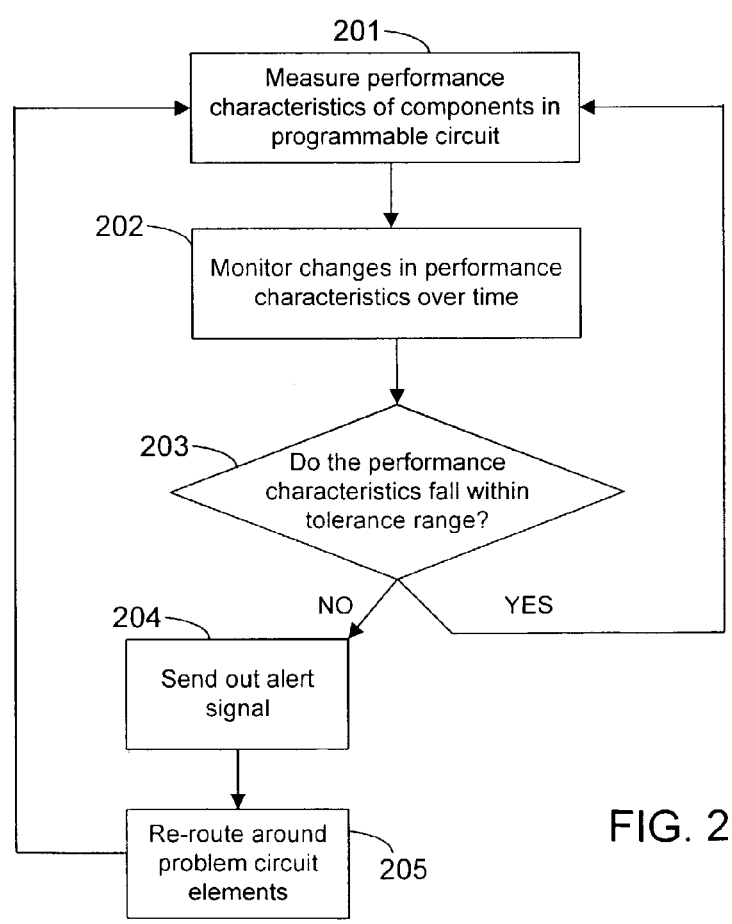
FIG. 2

TECHNIQUES FOR PROVIDING EARLY FAILURE WARNING OF A PROGRAMMABLE CIRCUIT

BACKGROUND OF THE INVENTION

This invention relates to techniques for providing an early warning of a potential failure on a programmable circuit, and more particularly, to techniques for monitoring the performance of a programmable circuit to detect a performance degradation and to provide an early warning of a potential failure.

Programmable integrated circuits comprise numerous programmable circuit elements that can be programmed to implement a variety of user circuit designs. Programmable integrated circuits typically contain logic elements that can be programmed to perform numerous logic functions. Programmable integrated circuits also include a programmable structure of interconnect conductors that can route signals between the programmable circuit elements.

Programmable integrated circuits sometimes fail to operate properly as a result of degradation in the performance of particular circuit elements. For example, particular circuit elements may operate at a lower speed, at a higher power, or at a reduced signal-to-noise ratio. As a result of the degradation in performance, the integrated circuit may not operate according to user defined specifications.

The performance of particular circuit elements can degrade over time. Eventually, performance degrades to the point that the programmable integrated circuit does not operate according to the user defined specifications. When the integrated circuit fails to operate properly according to the user defined specifications, it may be difficult to locate and isolate particular circuit elements causing the problem.

It would therefore be desirable to provide techniques for monitoring the performance of a programmable circuit to identify potential failures. It would also be desirable to provide an early warning of a potential failure on a programmable circuit.

BRIEF SUMMARY OF THE INVENTION

The present invention provides techniques for monitoring the performance of a programmable circuit and to provide an early warning of a potential failure. A processor monitors the performance of components on a programmable integrated circuit. Components include circuit elements and/or routing resources. The processor and the programmable circuit may be located on the same integrated circuit.

The processor measures performance characteristics (e.g., voltage, power, signal-to-noise ratio, etc.) for the components over time. The performance characteristics are stored in memory. If the performance characteristics for particular components fall outside tolerance ranges, these components are more likely to fail in the future.

Once the performance characteristics for particular components are outside the tolerance ranges, the processor sends out an alert signal. The alert signal indicates a performance degradation and the possibility of a future circuit failure. The processor may repair the programmable integrated circuit by re-routing around the problem components.

BRIEF DESCRIPTION OF THE DRAWINGS

FIG. 1A illustrates a memory device and an integrated circuit that includes a microprocessor, a programmable logic device, and memory according to the present invention;

FIG. 1B illustrates a memory device and an integrated circuit that includes a programmable logic device and memory according to the present invention; and FIG. 2 illustrates a flow chart of process steps that can be performed to implement the early failure warning techniques of the present invention.

DETAILED DESCRIPTION OF THE INVENTION

Techniques of the present invention are used to monitor the performance of a programmable circuit and to provide an early warning of a potential failure. The techniques of the present invention can be applied to a programmable circuit that has been configured according to a user design. In this embodiment, the techniques of the present invention are used to monitor the performance of a user configured programmable circuit that is being used for a user application in the field.

In other embodiments, the techniques of the present invention can be used to perform a reliability test on a programmable circuit after it has been manufactured. For example, a programmable circuit can be configured according to a test design after manufacture. The techniques of the present invention can then be used to monitor the performance of the programmable circuit and to provide an early warning of a potential failure on the programmable circuit. These techniques can indicate whether there are any potential problem areas on the programmable circuit. The monitored performance characteristics can indicate the reliability of the programmable circuit.

The principles of the present invention apply to any type of programmable circuit. For example, the present invention applies to programmable logic devices (PLD), field programmable gate arrays (FPGA), and programmable logic arrays (PLA). The present invention is mostly discussed primarily in the context of a PLD for illustrative purposes only. The present invention includes any type of programmable circuit and is not limited to PLDs.

FIG. 1A illustrates an integrated circuit 100 according to an embodiment of the present invention. Integrated circuit 100 includes a microprocessor 101, a programmable logic device 102, and memory cells 103. Microprocessor 101 is an embedded processor (i.e., a "hard wired" processor) on integrated circuit 100.

Integrated circuit 100 is also coupled to an external memory device 108. Data signals can be transferred between microprocessor 101 and PLD 102. Microprocessor 101 can store data in memory 103 and/or memory device 108.

Programmable logic device (PLD) 102 is configured according to a particular user design. PLD 102 may include components such as programmable logic elements, memory blocks, routing resources such as interconnect conductors and programmable connections between the conductors. Circuit elements and routing resources in PLD 102 are programmed to implement the user design. Microprocessor 101 stores data that indicates the user programmed states of the circuit elements and routing resources (e.g., in memory 103 or memory 108).

FIG. 1B illustrates an integrated circuit 110 according to another embodiment of the present invention. Integrated circuit 110 includes a programmable logic device 112, and memory cells 113. A subset of the programmable circuit elements within programmable logic device 112 are configured to implement a processor design. Thus, a portion of PLD 112 is a "soft" processor. For example, 500–600 logic elements in PLD 112 can be configured to perform the functionality of a processor.

The soft processor in PLD 112 stores data that indicates the user programmed states of the circuit elements and routing resources in PLD 112. For example, the soft processor configured into PLD 112 can store this data in memory 113 and/or memory device 108.

FIG. 2 illustrates a flow chart of process steps that can be performed to detect a performance degradation, according to an embodiment of the present invention. A performance degradation may indicate that the PLD will fail to operate according to user specifications in the near future.

Many of the functions discussed with respect to the present invention can be performed by an on-chip processor (e.g., microprocessor 101 or the soft processor in PLD 112), as will be discussed in detail below. In other embodiments, process steps of the present invention can be performed by one or more off-chip processors.

In step 201, an on-chip processor (such as microprocessor 101 or the soft processor in PLD 112) measures one or more performance characteristics of selected components in the programmable circuit. For example, microprocessor 101 or the soft processor in PLD 112 can test performance characteristics along selected signal paths in PLD 102/112 as a diagnostic check. The on-chip processor can also measure performance characteristics at selected nodes or of selected blocks in the PLD.

In particular, the on-chip processor can measure performance for selected logic elements, memory blocks, registers, look-up tables, etc. The processor can also test performance characteristics for selected routing resources including interconnection conductors that connect circuit elements on the PLD.

The on-chip processor can measure performance characteristics such as the voltage at particular nodes, the current through particular circuit elements, the power consumed by particular circuit elements, and the signal-to-noise ratio for particular signals in the PLD.

The on-chip processor can also test performance characteristics such as circuit speed. The speed of circuit elements and/or interconnection conductors can be determined based on the time delay between when an output signal is received in response to an input signal.

The on-chip processor can be programmed to measure the performance characteristic of certain critical components in the PLD (e.g., circuit elements, nodes, or routing resources). Critical components are components that have narrow tolerance range for particular performance characteristics compared to other components. A performance characteristic for a critical component can only deviate within a small range without causing the operation of the PLD to violate user-defined specifications.

For example, a particular group of circuit elements may lie along a critical signal path in the PLD. If the signal speed on this critical path falls below 5% of a ideal value, the PLD does not operate according to user specified timing constraints. Therefore, the circuit elements along this signal path are critical components. The on-chip processor can be programmed to monitor the speed of this critical signal path and other critical components on the PLD.

The processor can measure performance characteristics in the PLD continuously or at designated time intervals. For example, microprocessor 101 and the soft processor in PLD 112 can measure performance characteristics at regular, periodic time intervals. The processor can measure performance characteristics for critical components at more frequent time intervals than less critical components.

The on-chip processor stores the performance characteristics measured in step 201. The processor may store the performance characteristics in dedicated on-chip memory 103/113 or in an off-chip memory device 108.

At step 202, the on-chip processor monitors changes in the performance characteristics over time. The on-chip processor analyzes the monitored performance characteristics by comparing them to tolerance ranges. The tolerance ranges are selected to indicate a degradation in performance.

The tolerance ranges are more tightly defined than values that would indicate the PLD components are not operable. The tolerance ranges are selected to provide an early warning that the PLD or portions thereof may fail to operate at some point in the future. The tolerance ranges are not selected to indicate that any portion of the PLD has actually failed to operate according to user defined specifications.

For example, the voltage at a particular node can be sampled at different times. The processor determines if the voltage at that node is increasing or decreasing over time. The processor determines if the voltage falls outside a predefined tolerance range. If the voltage is outside the tolerance range, performance has degraded enough that the PLD is more likely to fail to operate according to a user's specifications at some future time. Although the voltage falling outside the tolerance range does not indicate a circuit failure or a violation of a user defined specification.

As another example, the on-chip processor can test the speed of a group of components on the PLD at several different time intervals. The processor stores the timing data from these tests in memory. At step 202, the on-chip processor analyzes the timing data for this particular group of components. If the timing data falls outside a tolerance range, performance has degraded enough that the PLD is more likely to fail to operate according to user defined specifications at some point in the future.

In one embodiment, the on-chip processor compares recent performance data from the PLD to pre-selected ideal values to determine if the recent performance data falls within the tolerance range. In another embodiment, the on-chip processor compares recent performance data to earlier measured performance data to determine if the recent data falls within the tolerance range.

The tolerance ranges are narrower for critical components and wider for non-critical components. Tolerance ranges for certain components may have up upper limit but no lower limit, or a lower limit, but no upper limit.

At decision node 203, the on-chip processor determines if the performance characteristics for components in the PLD fall within the tolerance ranges. The processor preferably analyzes several performance data values measured over a period of time to determine whether the monitored components are operating within tolerance ranges. By comparing data measured at more time intervals, the processor is able to more reliably determine if the components are operating within the tolerance ranges.

If the monitored performance characteristics fall within the tolerance ranges, the processor returns to step 201 and continues to check the current performance characteristics of the PLD at designates times.

If one or more of the monitored performance characteristics fall outside the corresponding tolerance ranges, the on-chip processor sends out an alert signal at step 204. The alert signal can be a system-wide message indicating that the performance of one or more components in the PLD have degraded. The alert signal is an indication that the performance degradation may cause the PLD to fail to operate according to user specifications. The alert signal is not necessarily an indication that the PLD has already failed to operate according to user specifications.

The alert signal is an early warning to the user that integrated circuit 100 may need to be replaced or reconfigured to avoid a circuit failure. By monitoring performance characteristics in the PLD and providing an early warning that the PLD may fail, a system wide failure can be prevented.

If a user does not become aware of degradation in the performance characteristics of the PLD, the user does not know to replace or repair the PLD until it has actually failed to operate according to specifications. When the PLD fails, it can adversely effect the operation of the entire system that the integrated circuit 100/110 is connected to. The cost of down time for a system such as network is often quite large. Therefore, it is undesirable to have a large amount of system down time.

Also, when a configured PLD fails, often the source of the failure cannot be quickly identified. The entire circuit board may need to be replaced to get the system up and running again. The original board is then analyzed and repaired using standard techniques. The cost of replacing the entire circuit board may be substantial.

By warning a user before the PLD actually fails, the techniques of the present invention give the user time to replace or repair the integrated circuit 100/110 before the PLD fails to operate and degrades the performance of the entire system. For example, a user can replace a line card from a chassis and then repair it to save cost, instead of letting it fail in-system and replacing it with a new card.

The present invention provides users with reliable early warning system for potential circuit failures. After the performance of a circuit has degraded sufficiently, the circuit can be replaced or repaired at the user's convenience, before the circuit fails. For example, a PLD can be repaired or replaced during a low usage time (e.g., early morning or on a weekend).

The early warning system of the present invention reduces costs associated within system down time and the cost of replacing an entire circuit board. The present invention also eliminates the need to test each integrated circuit on a board to determine the source of a performance degradation.

The alert signal can also indicate the identity and location of components on the PLD that are effected by the performance degradation. This information can be used by an external processor to repair the PLD.

At step 205, the components on the PLD that are experiencing a degradation in performance are repaired. In one embodiment, the on-chip processor repairs the degraded components by re-routing around them.

Preferably, a user specific design is spread out across the layout of the PLD. Circuit blocks in the PLD that are programmed to implement a user design are not clustered into one geographic area of the PLD layout. By spreading the user design across the PLD, unused circuit blocks and routing resources lie close to all of the programmed circuit block and routing resources.

As an example, only about 60% of the available resources on a PLD are programmed to implement a user design. The other 40% of the PLD resources are unused. These unused resources are available to be substituted for resources that fail to operate within tolerance ranges. The on-chip processor has access to the unused resources. The unused resources are typically invisible to the user.

For example, if a group of programmable logic elements on a PLD do not operate within tolerance ranges, the on-ship processor first identifies the logic elements, routing resources, and other components that are effected by the performance degradation. The on-chip processor then identifies unused logic elements and routing resources on the PLD. As discussed above, there are unused resources through the PLD. The on-chip processor selects unused logic elements that are physically close to the degraded logic elements in the PLD layout.

The on-chip processor repairs the PLD as follows. The processor programs the unused logic elements and routing resources to substitute for the degraded logic elements and routing resources. The unused logic elements are coupled according the user configured PLD design. The degraded logic elements are decoupled from the user design. Because there are unused resources throughout the PLD, less routing resources are needed to substitute the degraded logic elements with the unused logic elements.

In another embodiment of the present invention, an external off-chip processor repairs the PLD by re-routing around the degraded components. In further embodiments, the PLD can be repaired manually (e.g., by reconfiguring the entire PLD).

Once the PLD has been repaired at step 205, the on-chip processor continues to access performance characteristics of components in the PLD at step 201. In further embodiments of the present invention, any of the steps discussed above that are performed by the on-chip processor can be performed by an external off-chip processor.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for providing an early warning of a possible failure on a programmable circuit, the method comprising:
   measuring performance characteristics of components on the programmable circuit, wherein the performance characteristics are associated with programmed operational configurations of the components and programmable routing resources;
   determining if the performance characteristics fall within tolerance ranges; and
   if at least one of the performance characteristics falls outside one of the tolerance ranges, sending an alert signal indicating that the programmable circuit is more likely to fail to operate according to specifications.

2. The method of claim 1 wherein the programmable circuit has been configured according to a user design, and the method is performed to monitor the performance of the programmable circuit while the programmable circuit is being used for a user application.

3. The method of claim 1 wherein the method for providing the early warning of a possible failure on the programmable circuit is performed during a reliability test after manufacture of the programmable circuit.

4. The method of claim 1 further comprising:
   repairing the programmable circuit by replacing the components that caused the at least one performance characteristic to fall outside the tolerance range.

5. The method of claim 1 wherein the programmable circuit and a hard wired microprocessor reside on one integrated circuit, and the microprocessor determines if the performance characteristics fall within the tolerance ranges.

6. The method of claim 1 wherein a subset of programmable circuit elements in the programmable circuit are configured to function as a processor, and the processor determines if the performance characteristics fall within the tolerance ranges.

7. The method of claim 1 further comprising:
storing the performance characteristics in memory.

8. The method of claim 1 wherein measuring the performance characteristics further comprises:
measuring a voltage, a current, a signal-to-noise ratio, a power, or a speed of at least one of the components on the programmable circuit.

9. The method of claim 1 wherein measuring the performance characteristics of the components further comprises:
measuring performance characteristics of logic elements, routing resources, memory blocks, or registers.

10. The method of claim 1 wherein determining if the performance characteristics fall within the tolerance ranges further comprises:
comparing recent performance characteristics with earlier measured performance characteristics to determine if variations over time fall outside the tolerance ranges.

11. The method of claim 1 wherein determining if the performance characteristics fall within the tolerance ranges further comprises:
comparing recent performance characteristics with pre-selected values to determine if variations from the pre-selected values over time fall outside the tolerance ranges.

12. An integrated circuit comprising:
a programmable portion comprising components capable of being programmed with a plurality of programmable operational configurations; and
a processor that measures performance characteristics of at least some programmed operational configurations of the components programmed according to a user design, determines if the performance characteristics fall within tolerance ranges that are selected to indicate a performance degradation on the programmable portion, and sends out an alert signal if at least one of the performance characteristics falls outside one of the tolerance ranges.

13. The integrated circuit of claim 12 wherein the programmable portion is part of a programmable circuit that has been configured according to the user design, and the processor measures the performance characteristics of the components while the programmable circuit is being used for a user application.

14. The integrated circuit of claim 12 wherein the programmable portion is part of a programmable circuit, and the processor measures the performance characteristics of the components during a reliability test after manufacture of the programmable circuit.

15. The integrated circuit of claim 12 wherein the processor and the programmable portion are both part of a programmable circuit that resides on the integrated circuit.

16. The integrated circuit of claim 12 wherein the processor is a hard wired processor, and the programmable portion is a programmable circuit that does not include the processor.

17. The integrated circuit of claim 12 further comprising:
a memory that stores the measured performance characteristics.

18. The integrated circuit of claim 12 wherein the tolerance ranges are selected to indicate that performance characteristics have deviated enough such that the programmable portion is more likely to fail to operate according to user specifications.

19. The integrated circuit of claim 18 wherein the processor repairs the components that caused the at least one performance characteristics to fall outside the tolerance range by programming other components with user designed performance characteristics to replace the failing components.

20. The integrated circuit of claim 19 wherein the components that caused the at least one performance characteristic to fall outside the tolerance range include logic elements, and the processor substitutes the logic elements with unused logic elements.

21. The integrated circuit of claim 12 wherein the processor measures voltage, current, signal-to-noise ratio, power, or speed of at least one of the components in the programmable portion.

22. The integrated circuit of claim 12 wherein:
the processor measures performance characteristics of critical components on the programmable portion.

23. A computer program product, on a computer readable storage medium, for measuring performance characteristics of a programmable circuit, the computer program product comprising:
program code for measuring performance characteristics of components on a programmable circuit, wherein the components are capable of being programmed with a plurality of operational configurations;
program code for determining if the performance characteristics of at least one programmed operational configuration of a respective component fall within tolerance ranges; and
program code for sending an alert signal indicating a performance degradation, if at least one of the performance characteristics falls outside one of the tolerance ranges.

24. The computer program product of claim 23 wherein the tolerance ranges are selected to indicate that performance characteristics have deviated enough such that the programmable circuit is more likely to fail to operate according to user specifications.

25. The computer program product of claim 23 further comprising:
program code for routing around the components that caused the at least one performance characteristic to fall outside the tolerance range.

26. The computer program product of claim 25 wherein the program code for routing around the components that caused the at least one performance characteristic to fall outside the tolerance range further comprises:
program code for disabling first logic elements that caused the at least one performance characteristics to fall outside the tolerance range; and
program code for programming second unused logic elements to perform the functions of the first logic elements.

27. The computer program product of claim 23 wherein the program code for measuring performance characteristics and the program code for determining if the performance characteristics fall within tolerance ranges are implemented by a processor that resides on an integrated circuit with the programmable circuit.

* * * * *

UNITED STATES PATENT AND TRADEMARK OFFICE
CERTIFICATE OF CORRECTION

| | |
|---|---|
| PATENT NO. | : 7,062,685 B1 |
| APPLICATION NO. | : 10/317436 |
| DATED | : June 13, 2006 |
| INVENTOR(S) | : Jordan Plofsky et al. |

It is certified that error appears in the above-identified patent and that said Letters Patent is hereby corrected as shown below:

On the face sheet under Item (56) OTHER PUBLICATIONS:

kindly change "IDDQ" to --$I_{DDQ}$--

On the face sheet under ABSTRACT Item (57):

kindly change "may to fail to" to --may fail to--

Signed and Sealed this

Sixth Day of February, 2007

JON W. DUDAS
*Director of the United States Patent and Trademark Office*